US011546538B2

(12) United States Patent
Itano et al.

(10) Patent No.: US 11,546,538 B2
(45) Date of Patent: Jan. 3, 2023

(54) PHOTOELECTRIC CONVERSION APPARATUS, PHOTOELECTRIC CONVERSION SYSTEM, MOVING BODY, AND METHOD FOR CHECKING PHOTOELECTRIC CONVERSION APPARATUS

(71) Applicant: CANON KABUSHIKI KAISHA, Tokyo (JP)

(72) Inventors: Tetsuya Itano, Kanagawa (JP); Shinya Nakano, Osaka (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 17/103,774

(22) Filed: Nov. 24, 2020

(65) Prior Publication Data

US 2021/0168319 A1 Jun. 3, 2021

(30) Foreign Application Priority Data

Nov. 28, 2019 (JP) .............................. JP2019-215788

(51) Int. Cl.
*H04N 5/3745* (2011.01)
*B60R 1/00* (2022.01)
(Continued)

(52) U.S. Cl.
CPC ............. *H04N 5/3745* (2013.01); *B60R 1/00* (2013.01); *H01L 27/146* (2013.01); *H04N 5/3765* (2013.01); *H01L 31/107* (2013.01)

(58) Field of Classification Search
CPC ...... H04N 5/3745; H04N 5/3765; B60R 1/00; H01L 27/146; H01L 31/107
See application file for complete search history.

(56) References Cited

U.S. PATENT DOCUMENTS

2015/0281620 A1\* 10/2015 Usuda ............... H01L 27/14609
257/438
2019/0037211 A1 1/2019 Oguro
(Continued)

FOREIGN PATENT DOCUMENTS

EP 3696522 A1 8/2018
JP 2018061235 A 4/2018
(Continued)

*Primary Examiner* — Ahmed A Berhan
(74) *Attorney, Agent, or Firm* — Canon U.S.A., Inc. IP Division

(57) ABSTRACT

A photoelectric conversion apparatus includes an effective pixel circuit, a reference pixel circuit, a signal output unit, and a comparison unit. The effective pixel circuit includes a photoelectric conversion unit, and is configured to be controlled by using a control line and to output a digital signal based on electric charges generated by the photoelectric conversion unit. The reference pixel circuit includes a holding unit for holding the digital signal. The reference pixel circuit is configured to be controlled by using the control line together with the effective pixel circuit. The signal output unit is configured to output a signal to the holding unit so that a first digital signal with a predetermined value is held by the holding unit. The comparison unit is configured to compare the first signal with the digital signal output from the holding unit controlled to hold the first digital signal.

16 Claims, 9 Drawing Sheets

(51) Int. Cl.
    *H01L 27/146*     (2006.01)
    *H04N 5/376*     (2011.01)
    *H01L 31/107*     (2006.01)

(56) References Cited

U.S. PATENT DOCUMENTS

| | | | |
|---|---|---|---|
| 2019/0289213 A1 | 9/2019 | Kumaki | |
| 2020/0036918 A1* | 1/2020 | Ingle | ................. H01L 27/14621 |

FOREIGN PATENT DOCUMENTS

| | | |
|---|---|---|
| JP | 2018148528 A | 9/2018 |
| JP | 2019009768 A | 1/2019 |

* cited by examiner

PHOTOELECTRIC CONVERSION APPARATUS, PHOTOELECTRIC CONVERSION SYSTEM, MOVING BODY, AND METHOD FOR CHECKING PHOTOELECTRIC CONVERSION APPARATUS

BACKGROUND

Field

One disclosed aspect of the embodiments relates to a photoelectric conversion apparatus, a photoelectric conversion system, a moving body, and a method for checking the photoelectric conversion apparatus.

Description of the Related Art

Photoelectric conversion apparatuses are known to generate digital signals based on electric charges which generates in photoelectric conversion.

Japanese Patent Application Laid-Open No. 2019-9768 and Japanese Patent Application Laid-Open No. 2018-148528 discuss photoelectric conversion apparatuses having pixel circuits including a holding unit for holding a digital signal.

Japanese Patent Application Laid-Open No. 2018-61235 discusses a configuration in which analog signals are input to pixel circuits to form analog signals. Japanese Patent Application Laid-Open No. 2018-61235 discusses a technique for enabling a subsequent stage circuit to which a signal corresponding to the analog signal has been input to be identified which pixel row the signal is output from.

None of Japanese Patent Application Laid-Open No. 2019-9768, Japanese Patent Application Laid-Open No. 2018-148528, and Japanese Patent Application Laid-Open No. 2018-61235 consider a configuration and checking method suitable for inputting an address signal to pixel circuits in a configuration in which pixel circuits include a holding unit for holding a digital signal.

SUMMARY

According to an aspect of the present disclosure, a photoelectric conversion apparatus includes an effective pixel circuit, a reference pixel circuit, a signal output circuit, and a read control circuit. The effective pixel circuit includes a photoelectric conversion unit. The effective pixel circuit is configured to be controlled by using a control line and to output a digital signal based on electric charges generated by the photoelectric conversion unit. The reference pixel circuit includes a holding unit for holding the digital signal. The reference pixel circuit is configured to be controlled by using the control line together with the effective pixel circuit. The signal output unit, is configured to output a signal to the holding unit so that a first digital signal with a predetermined value is held by the holding unit. The read control unit is configured to read the digital signal from the holding unit controlled to hold the first digital signal.

According to another aspect of the present disclosure, a method for checking a photoelectric conversion apparatus is provided. The photoelectric conversion apparatus includes an effective pixel circuit and a reference pixel circuit. The effective pixel circuit includes a photoelectric conversion unit. The effective pixel circuit is configured to be controlled by using a control line and to output a digital signal based on electric charges generated by the photoelectric conversion unit. The reference pixel circuit includes a holding unit for holding the digital signal. The reference pixel circuit is configured to be controlled by using the control line together with the effective pixel circuit. The method includes outputting a signal to the holding unit so that a first digital signal with a predetermined value is held by the holding unit, and checking the photoelectric conversion apparatus by comparing the first digital signal with a digital signal read from the holding unit controlled to hold the first digital signal.

Further features of the present disclosure will become apparent from the following description of exemplary embodiments with reference to the attached drawings.

DESCRIPTION OF THE EMBODIMENTS

Each exemplary embodiment will be described below with reference to the accompanying drawings.

Exemplary embodiments will be described below focusing on an imaging apparatus as an example of a photoelectric conversion apparatus. The exemplary embodiments are not limited to an imaging apparatus but also applicable to other examples using photoelectric conversion apparatuses. Examples thereof include a distance measurement apparatus (an apparatus for distance measurement using focal point detection and time of flight, TOF), and a photometric apparatus (an apparatus for measuring the incident light quantity).

The conductivity type of the transistor according to the exemplary embodiments (described below) is to be considered as illustrative. The present disclosure is not limited to the conductivity type according to the exemplary embodiments. The conductivity type according to the exemplary embodiments can be suitably changed. With this change, the potentials of the gate, source, and drain of a transistor are suitably changed.

For example, if the conductivity type of a transistor operated as a switch is changed, the low and the high levels of the potential to be supplied to the gate may be reversed with respect to the description of the exemplary embodiments. The conductivity type of the semiconductor region according to the exemplary embodiments (described below) are to be considered as illustrative but not limited to the conductivity type according to the exemplary embodiments. The conductivity type according to the exemplary embodiments can be suitably changed. With this change, the potential of the semiconductor region is suitably changed.

Figure 1:
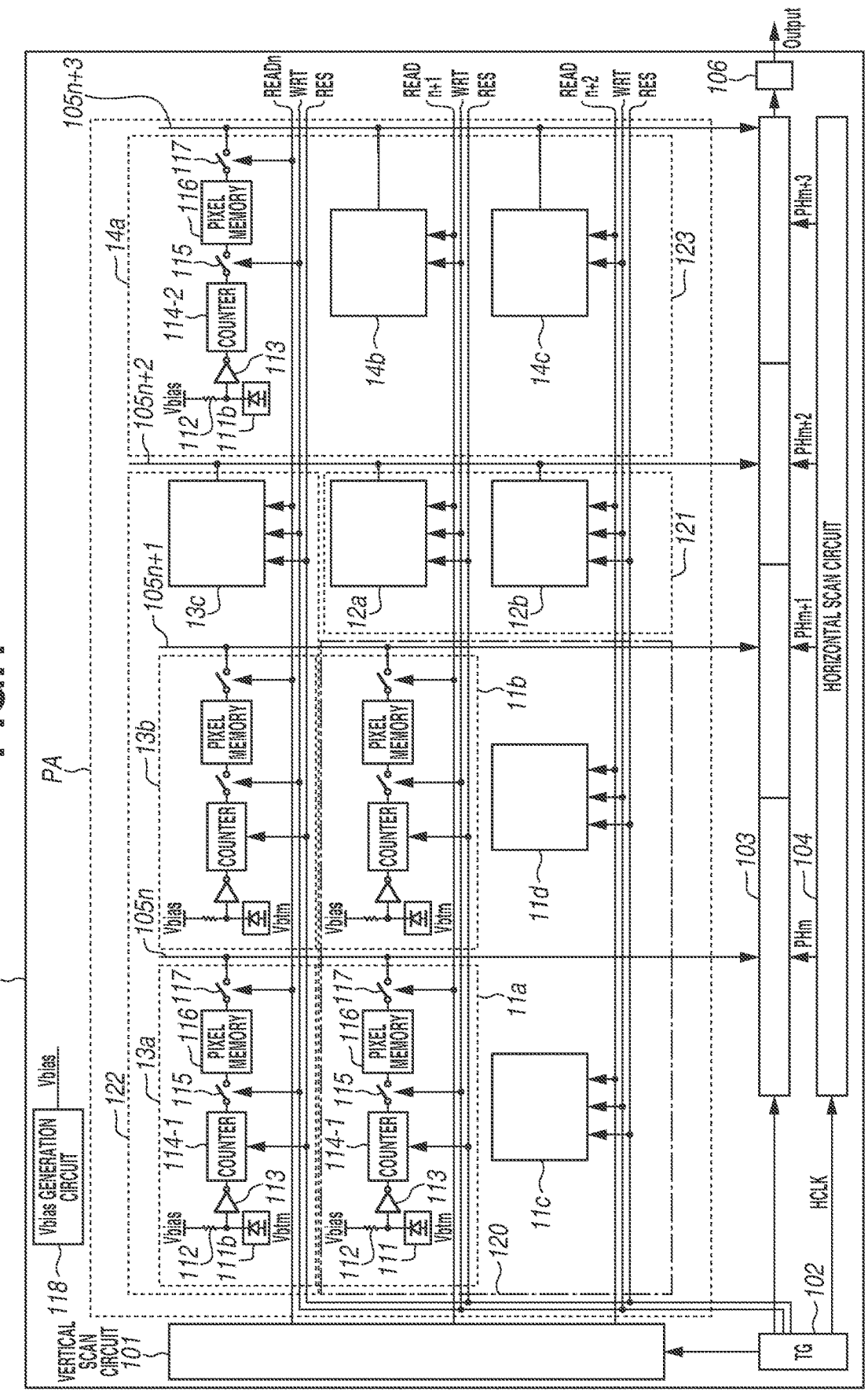
FIG. 1 illustrates a configuration of an imaging apparatus.

A first exemplary embodiment of the present disclosure will be described below. An imaging apparatus according to the present exemplary embodiment will be described below with reference to FIGS. 1, 2, and 3. FIG. 1 is a block diagram illustrating the imaging apparatus according to the present exemplary embodiment.

As illustrated in FIG. 1, an imaging apparatus 100 according to the present exemplary embodiment includes a vertical scan circuit 101, a timing generator (TG) 102, a column memory unit 103, and a horizontal scan circuit 104. The imaging apparatus 100 includes a plurality of pixel circuits 11, 12, 13, 14 disposed in matrix form.

The imaging apparatus 100 includes a pixel array PA. The pixel array PA includes an effective pixel region 120, a light shielded pixel region 121, a light shielded pixel region 122, and a reference pixel region 123. For simplification, the effective pixel region 120 is assumed to include four effective pixel circuits 11a to 11d. In the following description, the subscripts "a", "b", and the like are omitted from the description common to the respective configurations. For example, a description common to the configurations effective pixel circuit 11a to 11d will be described using reference numeral effective pixel circuit 11. The same applies to other configurations. The light shielded pixel region 121 includes light shielded pixel circuits 12a and 12b. The light shielded pixel region 122 includes light shielded pixel circuits 13a, 13b, and 13c. Each column in the light shielded pixel region 122 is not provided with the effective pixel circuits 11. By contrast, the shielded pixel circuits 12 included in the light shielded pixel region 121 are disposed, positioned, or located in the rows where the effective pixel circuits 11 are disposed. Each of the light shielded pixel circuits 12a, 12b, 13a, 13b, and 13c includes an avalanche diode 111b shielded from light. The reference pixel region 123 includes reference pixel circuits 14a, 14b, and 14c. Although FIG. 1 illustrates a state where 12 pixels are disposed, positioned, or located in the pixel array PA, more pixel circuits may be included in the pixel array PA as another example. For example, the effective pixel circuits 11 may be disposed in several thousand rows and several thousand columns. The light shielded pixel circuits 12 can also be disposed in the rows where the effective pixel circuits 11 are disposed. The shielded pixel circuits 13 can also be disposed in more rows. The reference pixel circuits 14 can also be disposed in the rows where the effective pixel circuits 11 are disposed and in the rows where the light shielded pixel circuits 13 are disposed.

The TG 102 is a control circuit for generating a signal for controlling each unit of the imaging apparatus 100. The TG 102 supplies various control signals to the vertical scan circuit 101 and the column memory unit 103. The TG 102 supplies a control signal HCLK to the horizontal scan circuit 104. The TG 102 further supplies a transfer control signal WRT and a reset control signal RES to the pixel circuits 11 to 14.

Each of the pixel circuits 11 to 14 includes an avalanche diode (hereinafter referred to as an AVD) 111, a quench element 112, an inverter 113 which is an example of a waveform shaping circuit, a counter 114, a transfer switch 115, a pixel memory 116, and a row selection switch 117. Referring to FIG. 1, the counters 114 included in the light shielded pixel circuits 12 and 13 are assigned a reference numeral 114-1, and the counters 114 included in the reference pixel circuit 14 are assigned a reference numeral 114-2. The input node of the inverter 113 is connected to the quench element 112 and an AVD 111. The output node of the inverter 113 is connected to the input node of the counter 114. The output node of the counter 114 is connected to the input node of the pixel memory 116 via the transfer switch 115. The output node of the pixel memory 116 is connected to a vertical signal line 105 via the row selection switch 117. The row selection switch 117 controls the connection state between the pixel memory 116 and the vertical signal line 105 based on a signal READ.

One node of the quench element 112 is connected to the AVD 111. The other node of the quench element 112 is connected to a Vbias node. The AVD 111 is applied with a bias voltage higher than the breakdown voltage of the AVD 111 from the Vbias node via the quench element 112. Thus, when photons are incident on the AVD 111, the avalanche multiplication phenomenon occurs. More specifically, the AVD 111 operates in the Geiger mode when the AVD 111 is applied with the bias voltage supplied from the Vbias node.

When the avalanche current is generated by the avalanche multiplication phenomenon, a voltage drop occurs in the quench element 112, resulting in a decrease in the cathode potential of the AVD 111. When the cathode potential falls down to the breakdown voltage of the AVD 111 or below, the avalanche multiplication phenomenon stops. As a result, the avalanche current stops flowing, and the cathode of the AVD 111 is applied with the bias voltage from the Vbias node. The quench element 112 is a resistive element for stopping the avalanche multiplication phenomenon of the AVD 111. This resistive element may be configured with a metal oxide semiconductor (MOS) transistor or a conducting layer, such as polysilicon.

The bias voltage of the Vbias node is, for example, around +20 V, but is not limited thereto. For example, the anode of the AVD 111 may be connected to a negative potential. More specifically, as described above, the potential difference between the anode and the cathode of the AVD 111 is to be higher than the breakdown voltage, and thus is set to +20 V or higher according to the present exemplary embodiment.

The above-described bias voltage is generated by a Vbias generation circuit 118. The Vbias generation circuit 118 is disposed outside the imaging apparatus 100. More specifically, the bias voltage is supplied from the outside of the imaging apparatus 100. The bias voltage may be generated inside the imaging apparatus 100.

The cathode of the AVD 111 is connected to the input node of the inverter 113. In response to the occurrence of the avalanche multiplication by photons being incident on the AVD 111, the cathode potential of the AVD 111 decreases (avalanche operation). The output of the inverter 113 changes with a decrease in the cathode potential. More specifically, in the steady state, the input node of the inverter 113 is applied with the bias voltage supplied from the Vbias node. The current which is generated by the avalanche multiplication (hereinafter referred to as an avalanche current) decreases the cathode potential of the AVD 111 to a potential value equal to or lower than a threshold value of the inverter 113. Accordingly, the output of the inverter 113 changes. When the cathode potential decreases, the potential difference between the anode and the cathode of the AVD 111 becomes lower than the breakdown voltage, and the AVD 111 enters the non-Geiger mode. Thus, the avalanche current stops flowing in the AVD 111. Subsequently, the cathode potential of the AVD 111 gradually returns to the bias voltage by the bias voltage supplied from the Vbias node and the current supplied by the quench element 112 (recovery operation). Accordingly, the output of the inverter 113 changes again. In this way, the avalanche operation and the recovery operation are repeated in the AVD 111. The inverter 113 generates a pulse signal based on the change of the potential of the input node, i.e., the cathode potential of the AVD 111. More specifically, the inverter 113 is a waveform shaping circuit for converting the cathode potential of the AVD 111 into a pulse signal. The pulse signal generated by the inverter 113 based on photons incident on the AVD 111 is referred to as a first pulse signal.

The counter 114 counts the number of pulses of the pulse signal output from the inverter 113. For example, the bit width (the number of bits) of the counter 114 is 16. The upper limit count value of the counter 114 having a 16-bit width is 65535 in decimal notation. The TG 102 inputs the reset control signal RES to the counter 114. The count value of the counter 114 is reset by the reset control signal RES. The counter 114 counts the first pulse signal in a predetermined time period. Accordingly, the count value corresponding to the number of photons incident on the AVD 111 in the predetermined period can be obtained as a digital signal. The counter 114 serves as a holding unit for holding the digital signal corresponding to electric charges generated by a photoelectric conversion unit. The pixel memory 116 is a second holding unit for holding the digital signal held by the counter 114 as a holding unit.

The transfer switch 115 is controlled by the transfer control signal WRT output from the TG 102. When the transfer control signal WRT becomes the High level, the transfer switch 115 turns ON. Accordingly, the digital signal held by the counter 114 is transferred to the pixel memory 116. Since the effective pixel circuits 11 include the pixel memory 116, the counter 114 can perform the count operation in a time period during which scanning is performed to read the digital signal from the pixel memory 116 in each row. Thus, a high frame rate can be achieved. Moreover, global shutter can be performed without providing a dead period during which the count operation is not possible. If the pixel memory 116 is not provided, the next count operation cannot be performed until the reading of the digital signal held by the counter 114 is completed. Thus, in a case where global shutter is performed by using a plurality of pixels that excludes the pixel memory 116, a dead period is to be provided during which the counter 114 waits until the reading of digital signals from the counter 114 of all effective pixel circuits 11 is completed. By contrast, since the pixel circuits 11 are provided with the pixel memory 116, the counter 114 can perform the next count operation without waiting until the reading of digital signals from the effective pixel circuits 11 is completed. The use of a plurality of pixels having the pixel memory 116 enables global shutter to be implemented without providing a dead period.

In the reference pixel circuits 14 (described below), the inverter 113 and the counter 114 are not connected to each other. Instead of the reset control signal RES, signals SET0, SET1, reset0, and reset1 (not illustrated) are input from the TG 102 (signal output unit) to the counter 114 in the reference pixel circuits 14.

The vertical scan circuit 101 is connected to a read control line READ disposed for each row of the pixel circuits 11 to 14.

The row selection switch 117 is controlled by using the read control line READ. When the read control line READ becomes the High level, the row selection switch 117 turns ON. Accordingly, the digital signal is read from the pixel memory 116 to the vertical signal line 105. The vertical scanning of the vertical scan circuit 101 sequentially reads the digital signal for each row of the pixel circuits 11 to 14. More specifically, the vertical scan circuit 101 is a read control unit or circuit for reading the digital signal from each pixel circuit. The number of rows to be selected is not necessarily one. For example, in a case where a plurality of sets of the vertical signal lines 105 is provided for the pixel circuits for each column, a plurality of rows can be selected at the same time.

In FIG. 1, the vertical signal line 105 is illustrated with a single line as a bus for transmitting digital signals. In a case where digital signals are read from the pixel memory 116 using parallel transmission, the vertical signal lines 105 corresponding in number to the bit width of the counter 114 and the pixel memory 116 are to be provided. For example, if the counter 114 has a 16-bit width, 16 vertical signal lines 105$n$ and 16 vertical signal lines 105$n$+1 are provided. In a case where digital signals are read from the pixel memory 116 using serial transmission, the vertical signal line 105 can be configured with a single signal line. Even if the parallel transmission is used, in a case where digital signals are read in units of a plurality of division groups, it is not always necessary to provide 16 vertical signal lines 105.

The column memory unit 103 is connected to a plurality of vertical signal lines 105. In a description of each individual signal line, the two vertical signal lines 105$n$ and 105$n$+1 out of the plurality of vertical signal lines 105 will be described. The vertical signal lines 105$n$ and 105$n$+1 are connected to the column memory unit 103. The column memory unit 103 holds the pixel signal value for the corresponding column read from the pixel circuits 11 to 14.

The horizontal scan circuit 104 sequentially outputs column selection signals PH$m$ to PH$m$+3 to the corresponding column memory unit 103 based on the control signal HCLK input from the TG 102. The column memory unit 103 to which the corresponding one of the active column select signals PH is input outputs held digital signal for the corresponding column to the processing unit 106. The digital signals output to the processing unit 106 are sequentially output to the outside of the imaging apparatus 100 via an output line Output.

The foregoing is the description of operations for reading digital signals from the pixel circuits 11 to 14. Digital signals based on the incident light are read from the effective pixel circuits 11. Operations for generating and reading digital signals based on the incident light are hereinafter referred to as "regular operations".

Figure 2:
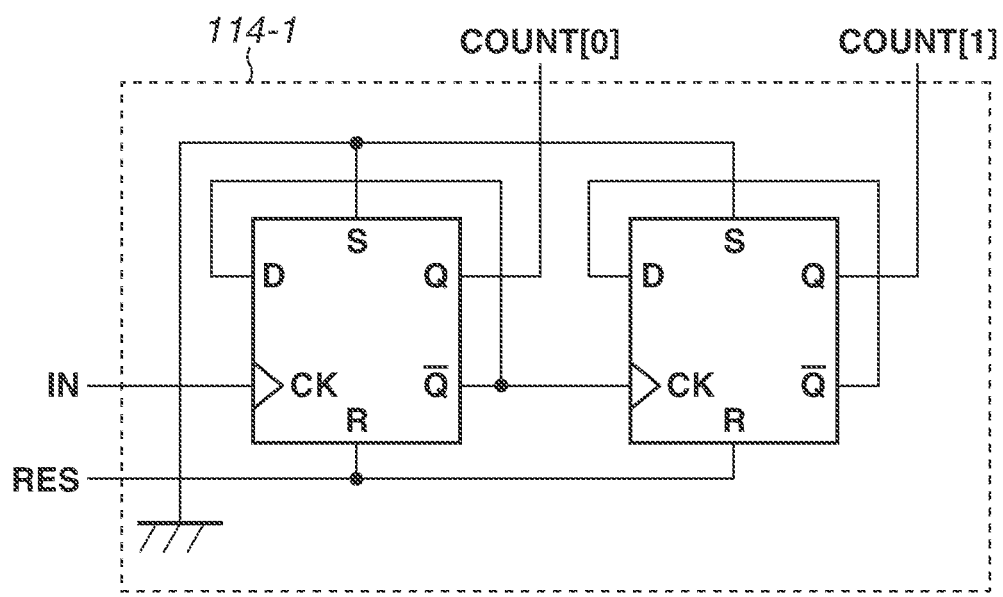
FIG. 2 illustrates a configuration of a counter in an effective pixel circuit and a light shielded pixel circuit.

Referring now to FIG. 2, a configuration of the counter 114-1 is illustrated as the counter 114 included in the effective pixel circuits 11$a$ to 11$d$ illustrated in FIG. 1.

To simplify descriptions, the counter 114-1 will be described below as a 2-bit counter. Naturally, the counter 114 may be a counter having a larger number of bits or may be a 1-bit counter.

The counter 114-1 includes two D flip-flop circuits.

The pulse output by the inverter 113 is input to the input terminal IN of the counter 114-1. The counter 114-1 performs a count operation in response to the rising edge of the pulse output by the inverter 113.

In FIG. 2, COUNT[0] indicates the output of the least significant bit (LSB) of the 2-bit counter, and COUNT[1] indicates the output of the most significant bit (MSB) thereof.

Each of the two D flip-flop circuits has a reset terminal R and a set terminal S. In response to a high-level signal being input to the reset terminal R, the output of the output terminal Q is initialized to the low level. In response to a high-level signal being input to the set terminal S, the output of the output terminal Q is initialized to the high level.

The input signals to the reset terminal R and the set terminal S are each set so that the two terminals R and S do not become the high level at the same time.

When reset control signal RES set to the high level is input from the TG 102 to the reset terminal R of the counter 114-1 of the effective pixel circuits 11, the count value of the counter 114-1 is initialized to 0. Subsequently, the counter 114-1 counts 0, 1, 2, and 3 in response to the rising edge of the pulse output from the inverter 113.

In the counter 114-1 of the effective pixel circuits 11, the signal to be supplied to the set terminal S of the D flip-flop circuit is set to the low level. In FIG. 2, the low level is set to the ground potential.

Figure 3:
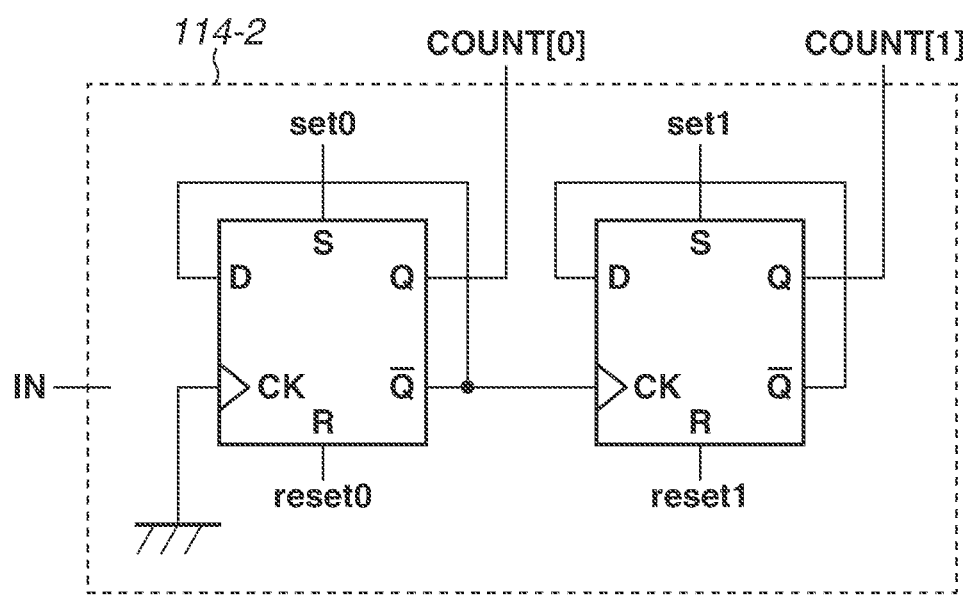
FIG. 3 illustrates a configuration of a counter in a reference pixel circuit.

Referring now to FIG. 3, a configuration of the counter 114-2 is illustrated as the counter 114 included in the reference pixel circuits 14.

A difference between the counter 114-2 and the counter 114-1 will be described below. A signal with a predetermined level is input to each of the reset terminal R and the set terminal S of the D flip-flop circuit included in the counter 114-2. The clock terminal CK of the first-stage D flip-flop circuit is applied with the ground potential. The output of the inverted output terminal Q–("–" above "Q" in FIG. 3) of the first-stage D flip-flop circuit is input to the clock terminal CK of the second-stage D flip-flop circuit. The signal to be input to the clock terminal CK of the second-stage D flip-flop circuit is set to the low level (ground potential). The values of COUNT[0] and COUNT [1] of the counter 114-2 are set based on the signal values of signals set0 and sea output from the TG 102. Thus, the counter 114-2 included in the reference pixel circuits 14 is not provided with the function of counting a pulse. This counter is not substantially a counter but a circuit having a role of holding a digital signal.

Figure 4:
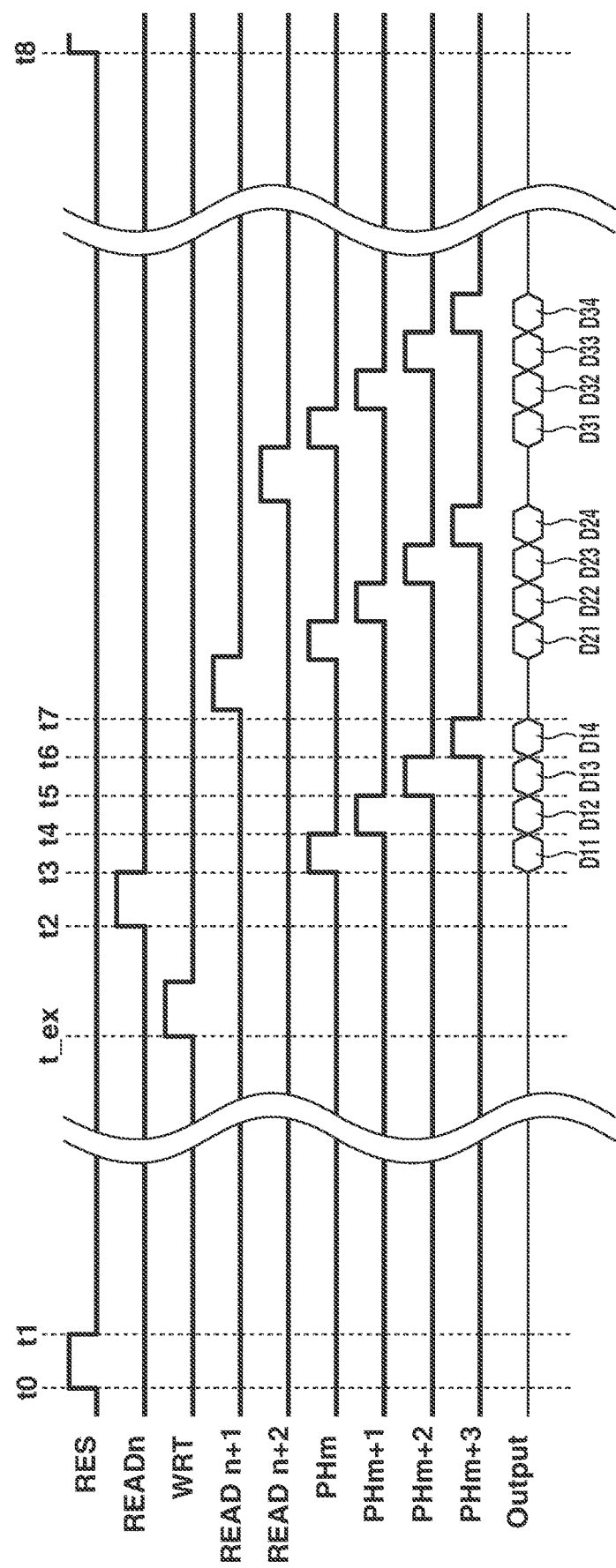
FIG. 4 is a timing chart illustrating operations of the imaging apparatus.

The digital signal having a predetermined value held by the counter 114-2 in the reference pixel circuits 14 is a digital signal (address signal) indicating the row position where each reference pixel circuit 14 is disposed. In the counter 114-2 in the reference pixel circuits 14 disposed in row n, for example, both the signals set0 and set1 output from the TG 102 are set to the low level. Accordingly, the counter 114-2 holds a digital signal having a value of zero for both COUNT[0] and COUNT[1]. In the counter 114-2 in the reference pixel circuits 14 disposed in row n+1, the signals set0 and set1 output from the TG 102 are set to the low and the high levels, respectively. Accordingly, the counter 114-2 holds a digital signal having a value of zero for COUNT[0] and a value of one for COUNT[1]. Similarly, in the counter 114-2 in the reference pixel circuits 14 disposed in row n+2, the signals set0 and set1 output from the TG 102 are set to the high and the low levels, respectively. Accordingly, the counter 114-2 holds a digital signal with a value of one for COUNT[0] and a value of zero for COUNT[1]. Similarly, in the counter 114-2 in the reference pixel circuits 14 disposed in row n+3, both the signals set0 and set1 output from the TG 102 are set to the high level. Accordingly, the counter 114-2 holds a digital signal having a value of one for both COUNT[0] and COUNT[1]. In this way, the counter 114-2 in the reference pixel circuits 14 holds a digital signal having a different value for each row, depending on the signal levels of the signals set0 and set1. Thus, the digital signal held by each reference pixel circuit 14 functions as an address signal indicating the row position where the reference pixel circuit 14 is disposed. The digital signal held by the counter 114-2 of each reference pixel circuit 14 is output to the corresponding pixel memory 116 when the transfer control signal WRT becomes the high level. According to the present exemplary embodiment, the TG 102 which is a signal output unit or circuit outputs an address signal serving as a signal for enabling the counter 114-2 to hold an address, to the counter 114-2, which is a holding unit. As another example, the TG 102 may output a predetermined control signal to the counter 114-2 so that the holding unit holds the address signal (second exemplary embodiment is an example thereof). FIG. 4 is a timing chart illustrating operations of the imaging apparatus 100 illustrated in FIG. 1.

At time t0, the TG 102 sets the reset control signal RES to the high level. This resets the count value of the counter 114 in each of the effective pixel circuit 11 and the light shielded pixel circuits 12 and 13. By contrast, a count signal having a predetermined value is held by the counter 114 in the reference pixel circuits 14.

At time t1, the TG 102 sets the reset control signal RES to the low level. This cancels the reset state of each of the effective pixel circuit 11 and the light shielded pixel circuits 12 and 13. The counter 114 in each of the effective pixel circuit 11 and the light shielded pixel circuits 12 and 13 counts pulses output by the inverter 113 included in each circuit.

At time t_ex, the TG 102 sets the transfer control signal WRT to the high level and then to the low level. Accordingly, the count value of the counter 114 in each of the effective pixel circuit 11 and the light shielded pixel circuits 12 and 13 is held by the pixel memory 116 included in each circuit. In the reference pixel circuits 14, the digital signal (address signal) held by the counter 114-2 is held by the pixel memory 116 in the reference pixel circuits 14.

At time t2, the vertical scan circuit 101 sets a signal READn to be output to the pixel circuits in row n to the high level. This causes a digital signal to be output from the pixel memory 116 in each of the light shielded pixel circuits 13a, 13b, and 13c and the reference pixel circuit 14a disposed in row n, as illustrated FIG. 1, to the corresponding one of vertical signal lines 105n to 105n+3. The digital signal output from the pixel memory 116 in the light shielded pixel circuits 13a, 13b, and 13c corresponds to a dark level. By contrast, the digital signal output from the pixel memory 116 in the reference pixel circuits 14 is a digital signal indicating the pixel position in row n (address signal). The column memory unit 103 for each column holds the digital signal output from each of the corresponding vertical signal lines 105n to 105n+3.

The horizontal scan circuit 104 then sequentially sets signals PHm to PHm+3 to the high level. Thus, a digital signal is output from each column of the column memory unit 103 to the processing unit 106.

The vertical scan circuit 101 then sequentially controls the pixel circuits in rows n+1 and n+2 on a row basis, as in the control of the pixel circuits in row n. Thus, a digital signal held by each pixel circuit is output to the processing unit 106.

In FIG. 4, digital signals output by the processing unit 106 are referred to as D11 to D14, D21 to D24, D31 to D34, and D41 to D44. The digital signals D11 to D14 are output by the pixel circuits in row n. More specifically, the digital signals D11, D12, and D13 are output by the light shielded pixel circuits 13a, 13b, and 13c, respectively. The digital signal D14 is output by the reference pixel circuit 14a.

The digital signals D21 to D24 are output by the pixel circuits in row n+1. More specifically, the digital signals D21, D22, and D23 are output by the effective pixel circuits 11a and 11b and the light shielded pixel circuit 12a, respectively. The digital signal D24 is output by the reference pixel circuit 14b.

The digital signals D31 to D34 are output by the pixel circuits in row n+2. More specifically, the digital signals D31, D32, and D33 are output by the effective pixel circuits 11c and 11d and the light shielded pixel circuit 12b, respectively. The digital signal D34 is output by the reference pixel circuit 14c.

More specifically, the digital signals D14, D24, and D34 are address signals output by the reference pixel circuits 14a, 14b, and 14c, respectively.

The processing unit or circuit 106 checks whether the digital signals D14, D24, and D34 which are address signals correspond to signals output to the reference pixel circuits 14a, 14b, and 14c, respectively. More specifically, the processing unit or circuit 106 serves as a comparison unit, comparison circuit, or comparator that compares the input signals with expectation values. In a case where all of the digital signals D14, D24, and D34 correspond to the signals output to the reference pixel circuits 14a, 14b, and 14c, respectively, the imaging apparatus is determined to be normally operating.

By contrast, in a case where the processing unit 106 detects that at least either one of the digital signals D14, D24, and D34 fails to correspond to the signals output to the reference pixel circuits 14a, 14b, and 14c, respectively, the imaging apparatus 100 is determined to be in a failed state. A failed pixel row can be identified by identifying which of the digital signals D14, D24, and D34 fails to correspond to the signals output by the reference pixel circuits 14a, 14b, and 14c, respectively. For example, in a case where the digital signal D14 does not corresponding to the signal output to the reference pixel circuit 14a (e.g., the two signals are unmatched or at least one bit of the digital signal is missing), it is identified that a control line failure or a control failure for the vertical scan circuit 101 occurs in row n. The control line refers to any one of the control lines for transmitting the reset control signals RES, the transfer control signal WRT, and the signal READ. Examples of control line failures include disconnection and contact with other control lines. A control failure for the vertical scan circuit 101 refers to a failure of a circuit related to the generation and output of a signal for controlling a pixel row (the signal READn according to the present exemplary embodiment). In an imaging apparatus for performing a rolling shutter operation (described below), control on a pixel row basis by the vertical scan circuit 101 will be performed not only for the signal READ but also for the reset control signals RES and the transfer control signal WRT. In this case, it is identified that a failure occurs in a pixel row in row n even if a failure occurs in reset control signals RES and the transfer control signal WRT.

The imaging apparatus according to the present exemplary embodiment uses digital signals as address signals to be input to the reference pixel circuits 14. Japanese Patent Application Laid-Open No. 2019-9768 discusses a technique for forming an address signal in at least one reference pixel circuit by differentiating respective analog signals to be input to each reference pixel circuit. However, there is a subject that, in order to differentiate the respective analog signals for each reference pixel circuit, an analog signal output circuit for which signal level is adjustable with high accuracy is to be provided. There is another subject that incorrect determination is likely to occur depending on noise superposed on an analog signal. More specifically, a failure may be determined although no failure occurs in the imaging apparatus. By contrast, the imaging apparatus according to the present exemplary embodiment can be configured to be immune to noise effects since digital signals are output to the reference pixel circuits. The accuracy of the signal level of a digital signal is more likely to be permitted than an analog signal even with low accuracy. Thus, the imaging apparatus according to the present exemplary embodiment produces advantageous effects of improving the accuracy of failure determination and simplifying the address signal generation.

Japanese Patent Application Laid-Open No. 2019-9768 discusses an example of binarizing an address signal for identifying a pixel row. In such a case, a plurality of reference pixel circuits is to be provided to enable the reference pixel circuits to hold address signals for identifying three or more pixel rows. By contrast, the imaging apparatus according to the present exemplary embodiment enables the reference pixel circuits 14 to hold digital signals with a plurality of bits. This means that the imaging apparatus according to the present exemplary embodiment produces an advantageous effect of reducing the number of reference pixel circuits for holding address signals.

In such a way, the imaging apparatus according to the present exemplary embodiment includes the reference pixel circuits 14a, 14b, and 14c for holding address signals which are digital signals. By determining whether this address signals correspond to the digital signals output by the reference pixel circuits 14a, 14b, and 14c, it becomes possible to detect whether a failure occurs in the photoelectric conversion apparatus (imaging apparatus). If a failure occurs in the imaging apparatus, the pixel row where the failure exists can be identified.

In the present exemplary embodiment, the global shutter operation has been described in which the exposure period of the effective pixel circuits 11 in a plurality of rows and a plurality of columns is started and ended at the same time. The present exemplary embodiment is however not limited to this example, and the rolling shutter operation may be application in which the start and end of the exposure period is sequentially controlled for each pixel row of the effective pixel circuits 11. To perform the rolling shutter operations, control lines for the reset control signals RES and the transfer control signal WRT are separated for each pixel row, as in the signal READn. The rolling shutter operation can be implemented by differentiating between the timing of the low level of the reset control signal RES and the timing of the low level of the transfer control signal WRT for each pixel row.

In the present exemplary embodiment, a configuration has been described in which each pixel circuit includes the transfer switch 115 and the pixel memory 116. The present exemplary embodiment is however not limited to this example, and each pixel circuit may exclude the transfer switch 115 and the pixel memory 116. In such a configuration, the counter 114 is connected to the switch 117 that is controlled by using the signal READn. This switch 117 controls the connection state between the counter 114 and the vertical signal line 105 based on the signal READn. Even in such a configuration, the imaging apparatus 100 according to the present exemplary embodiment can perform an imaging operation. In particular, in an imaging apparatus not having a mode for performing the global shutter operation, downsizing of pixel circuits can be achieved by omitting the transfer switch 115 and the pixel memory 116. In a front-illuminated imaging apparatus, the area of the avalanche diode 111 can be enlarged by omitting the transfer switch 115 and the pixel memory 116. By contrast, in an imaging apparatus for performing the global shutter operation, it is preferable to provide the transfer switch 115 and the pixel memory 116 to achieve a high frame rate. The providing of the pixel memory 116 enables the counter 114 to perform the count operation in the next exposure period before completion of reading of digital signals from the pixel circuits in all rows. Thus, the global shutter operation with a high frame rate can be achieved.

Figure 5:
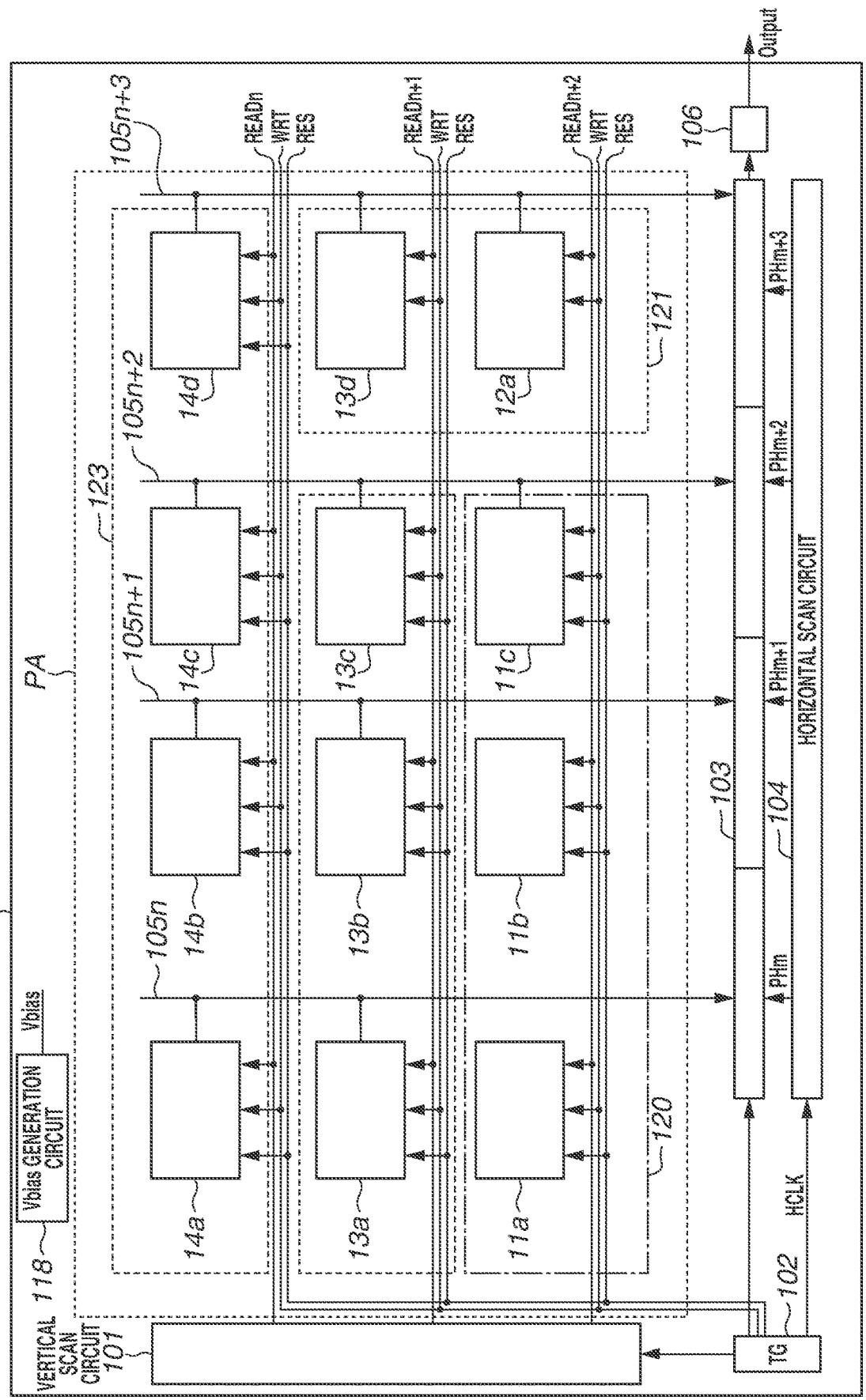
FIG. 5 illustrates another configuration of the imaging apparatus.

In the present exemplary embodiment, an example has been described where the reference pixel circuit 14 is provided in a plurality of rows. However, the present exemplary embodiment is not limited thereto. The reference pixel circuit 14 may be provided in a plurality of columns, as illustrated in FIG. 5. In such a configuration, it is possible to detect whether a failure of the vertical signal line 105n, a scan failure of the horizontal scan circuit 104, or a failure of the column memory unit 103 occurs.

In the present exemplary embodiment, a configuration has been illustrated in which each pixel circuit includes the counter 114 and the pixel memory 116. The present exemplary embodiment is not limited to this configuration. For example, a plurality of pixel circuits may share a single counter 114 and a single pixel memory 116. A plurality of photoelectric conversion units may share a single counter 114 and a single pixel memory 116.

In the present exemplary embodiment, an example has been described where the photoelectric conversion unit included in each of the effective pixel circuits 11, the light shielded pixel circuits 12 and 13, and the reference pixel circuits 14 is an avalanche diode. The present exemplary embodiment is however not limited thereto but applicable generally to configurations in which pixel circuits include a holding unit for holding a digital signal. More specifically, the photoelectric conversion unit may be a photodiode for accumulating electric charges generated by the photoelectric conversion. In such a configuration, each pixel circuit includes an analog-to-digital (AD) conversion unit for generating a digital signal based on signal charges accumulated in the photodiode. In such a configuration, the digital signal generated by the AD conversion unit is to be held by the holding unit included in each pixel circuit. A plurality of pixel circuits may share a single AD conversion unit and a single holding unit. A plurality of photoelectric conversion units may share a single AD conversion unit and a single holding unit.

A second exemplary embodiment will be described below focusing on differences from the first exemplary embodiment. The present exemplary embodiment is different from the first exemplary embodiment in the configuration of the counter 114 included in the reference pixel circuits 14.

Figure 6:
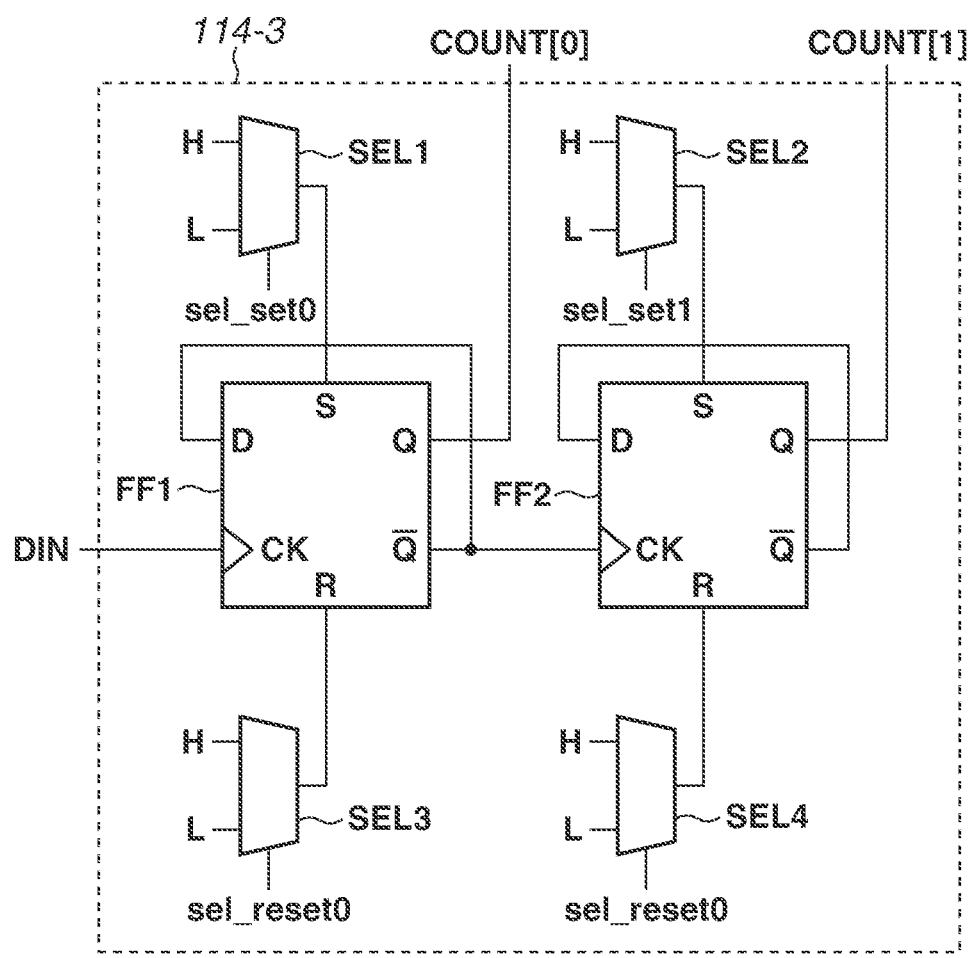
FIG. 6 illustrates another configuration of the counter in the reference pixel circuit.

FIG. 6 illustrates a configuration of the counter 114-3 included in the reference pixel circuits 14 according to the present exemplary embodiment. The counter 114-3 is provided instead of the counter 114-2 according to the first exemplary embodiment. The counter 114-3 according to the present exemplary embodiment includes a selection circuit SEL1 to which a signal sel_set0 is input, and a selection circuit SEL2 to which a signal sel_set1 is input. The counter 114-3 further includes a selection circuit SEL3 to which a signal sel_reset0 is input, and a selection circuit SEL4 to which a signal sel_reset1 is input. The selection circuit SEL1 is connected to the set terminal S of the flip-flop circuit FF1. The selection circuit SEL2 is connected to the set terminal S of the flip-flop circuit FF2. The selection circuit SEL3 is connected to the reset terminal R of the flip-flop circuit FF1. The selection circuit SEL4 is connected to the reset terminal R of the flip-flop circuit FF2. The signals sel_set0, sel_set1, sel_reset0, and sel_reset1 are supplied from the TG 102. In this example, the TG 102 serving as a signal output unit outputs control signals as signals for enabling the counter 114-3 to hold a digital signal with a predetermined value. The signal output unit may be provided outside the photoelectric conversion apparatus. In such a case, the signals sel_set0, sel_set1, sel_reset0, and sel_reset1 are supplied from the outside of the photoelectric conversion apparatus.

According to the present exemplary embodiment, a signal DIN is input to the clock terminal of the flip-flop circuit FF1. As the signal DIN, a pulse may be input from the TG 102, or a generation circuit for generating a pulse signal may be provided inside the reference pixel circuits 14. The signal DIN may be supplied from the outside of the photoelectric conversion apparatus.

In the configuration of the counter 114-3, the high or low level of the signals output to the S terminals of the flip-flop circuits FF1 and FF2 is selected by the selection circuits SEL1 and SEL2 according to the signal level of the signals sel_set0 and sel_set1, respectively. This configuration makes it possible to suitably change the address signals held by the reference pixel circuits 14. For example, the reference pixel circuit 14a holds an address signal with a value of 00 in a certain frame, and holds an address signal with another value in another frame. This improves the accuracy of detecting a failure in the counter 114-3 in the reference pixel circuits 14. This enables improving the accuracy of detecting a failure in the vertical scan circuit 101 and in either one of control lines for transmitting the reset control signals RES, the transfer control signal WRT, and the signal READ.

The present exemplary embodiment also makes it possible to reduce a checking time. Operations of the present exemplary embodiment will be described below.

Figure 7:
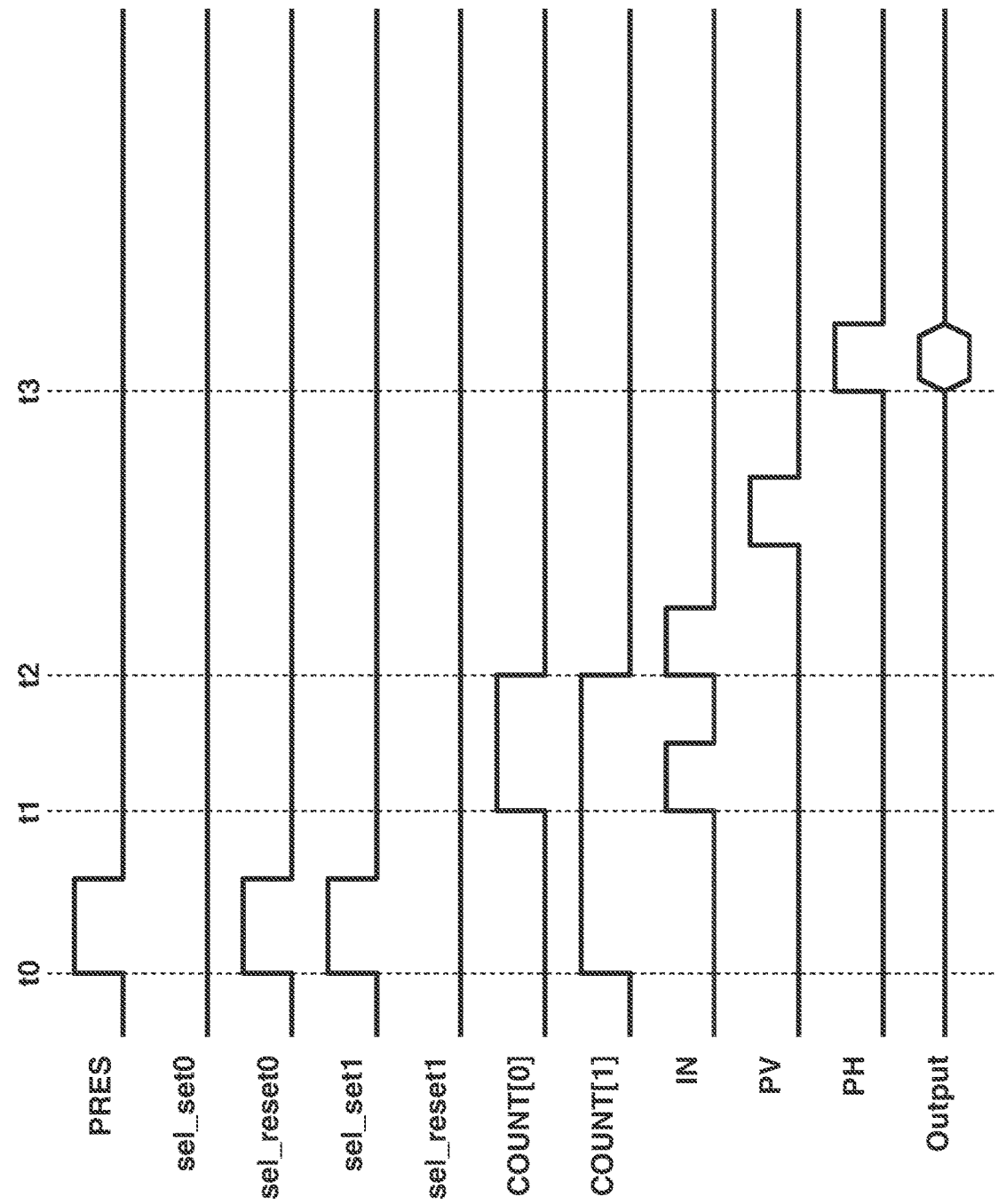
FIG. 7 is another timing chart illustrating operations of the imaging apparatus.

FIG. 7 is a timing chart illustrating operations of the counter 114-3 illustrated in FIG. 6. Here, the timing chart will be described below focusing on operations of the counter 114-3. Operations of other circuits may follow the operations illustrated in FIG. 4.

The maximum value of the address signal held by the counter 114-3 and the address signal to be held next are checked.

At time t0, the value of the maximum value of the address signal-1LSB is written to the counter 114-3.

At time t1, the signal DIN to be input to the clock terminal of the flip-flop circuit FF1 is toggled. Thus, when the value of the digital signal held by the counter 114-3 increases by 1LSB, the digital signal is maximized (all bits from MSB to LSB are set to 1).

At time t2, the signal DIN is toggled again. This enables the checking of the transition operation of the counter 114-3, i.e., the maximum value-1LSB, the maximum value, and then 0. According to the present exemplary embodiment, at time t2, the value of the digital signal held by the counter 114-3 is assumed to be 0. As another example, if the counter 114-3 includes a clipping circuit for clipping the digital signal to a predetermined value (e.g., the maximum value), the counter 114-3 can check the transition of the digital signal value, i.e., the maximum value-1, the maximum value, and then the maximum value. Thus, after the digital signal having the predetermined value is held by the counter 114, the toggled signal DIN as a pulse signal for changing the digital signal is supplied. This enables inspection of the operation of the counter 114 serving as a holding unit, that is, checking whether the counter 114 normal operates.

The digital signal output by the counter 114-3 in the reference pixel circuits 14 is input to the processing unit 106. The processing unit 106 compares the input digital signal with an expectation value to check whether a failure of the counter 114-3. The comparison between the output of the counter 114-3 and the expectation value may be performed outside the photoelectric conversion apparatus.

An example of a check relating to a digital signal with the maximum value has been described above. As another example, a check relating to optional values other than the maximum value is also possible by suitably changing the drive of the signals sel_reset0, sel_reset1, sel_set0, and sel_set1.

The check of the counter 114-3 in the reference pixel circuits 14 has been described above. As another example, the counter 114 including the selection circuits SEL1 to SEL4 is provided also in the effective pixel circuits 11 and the light shielded pixel circuits 12, thus checking the counter 114. In such a case, the output of the inverter 113 may be used as the signal DIN. More specifically, the output of the avalanche diode 111 (the avalanche diode 111b for the light shielded pixel circuits 12) may be used.

In order to effectively check the vertical signal line 105 and the column memory unit 103, it is preferable to write a digital signal to the counter 114 of the pixel circuits so that digital signals with the maximum and the minimum values are alternately output to the vertical signal line 105. More specifically, in the configuration illustrated in FIG. 1, a digital signal with all bits set to 0, that is, the minimum value, is written to the counter 114-1 in the light shielded pixel circuit 13a disposed, for example, in row 1 and column 1. A digital signal with all bits set to 1, that is, the maximum value, is written to the counter 114-1 in the light shielded pixel circuit 13b in the adjacent column 2 A digital signal with all bits set to 0, the minimum value, is written to the counter 114-1 in the light shielded pixel circuit 13c in the adjacent column 3.

A digital signal with all bits set to 1, or the maximum value, is written to the counter 114-1 in the effective pixel circuit 11a disposed in row 2 and column 1. A digital signal with all bits set to 0, or the minimum value, is written to the counter 114-1 in the effective pixel circuit 11b disposed in row 2 and column 2. A digital signal with all bits set to 1, or the maximum value, is written to the counter 114-1 in the light shielded pixel circuit 12a disposed in row 2 and column 3.

When the vertical scan circuit 101 selects the pixel circuits in row 1, a digital signal with the minimum value is output to the vertical signal line 105n. The corresponding column memory unit 103 holds the digital signal with the minimum value. When the signals of the pixel circuits in row 1 are read, a digital signal with the maximum value is output to the vertical signal line 105n+1. The corresponding column memory unit 103 holds the digital signal with the maximum value. When the signals of the pixel circuits in row 1 are read, a digital signal with the minimum value is output to the vertical signal line 105n+2. The corresponding column memory unit 103 holds the digital signal with the minimum value. When the horizontal scan circuit 104 sequentially sets the signals PHm to PHm+3 to the high level, digital signals with the maximum and the minimum values are alternately output from the column memory unit 103. The operation of alternatively outputting digital signals with the maximum and minimum values from the column memory unit 103 exerts a high load to the transfer path between the column memory unit 103 and the processing unit 106. This enables an appropriate check of whether the transfer path between the column memory unit 103 and the processing unit 106 normally operates even if a high load arises.

Next, when the vertical scan circuit 101 selects the pixel circuits in row 2, a digital signal with the maximum value is output to the vertical signal line 105n. The corresponding column memory unit 103 holds the digital signal with the maximum value. When the vertical signal line 105n in column 1 is focused, a digital signal with the minimum value is output in the signal reading from the pixel circuits in row 1. A digital signal with the maximum value is output in the signal reading from the pixel circuits in row 2. More specifically, digital signals with the minimum and the maximum values are alternately output to the vertical signal line 105. Similarly, the column memory unit 103 alternately holds digital signals with the minimum and the maximum values. Similarly, digital signals with the minimum and the maximum values are also alternately output to the vertical signal line 105 and the column memory unit 103. Accordingly, a high load is exerted on the vertical signal line 105. This enables a suitable checking of whether the vertical signal line 105 normally operates even if a high load is exerted on the vertical signal line 105. In some cases, the vertical signal line 105 may be a bus having a plurality of transfer lines for parallelly transferring a signal having a plurality of bits. In the check according to the present exemplary embodiment, all bits of the signals are updated through the read operation in rows 1 and 2. Accordingly, it is possible to check whether all of the plurality of transfer lines normally operate. In the column memory unit 103, all bits of memory will be updated. This enables a check of whether the signal holding operation can be normally performed for all bit of memory in the column memory unit 103.

Figure 8:
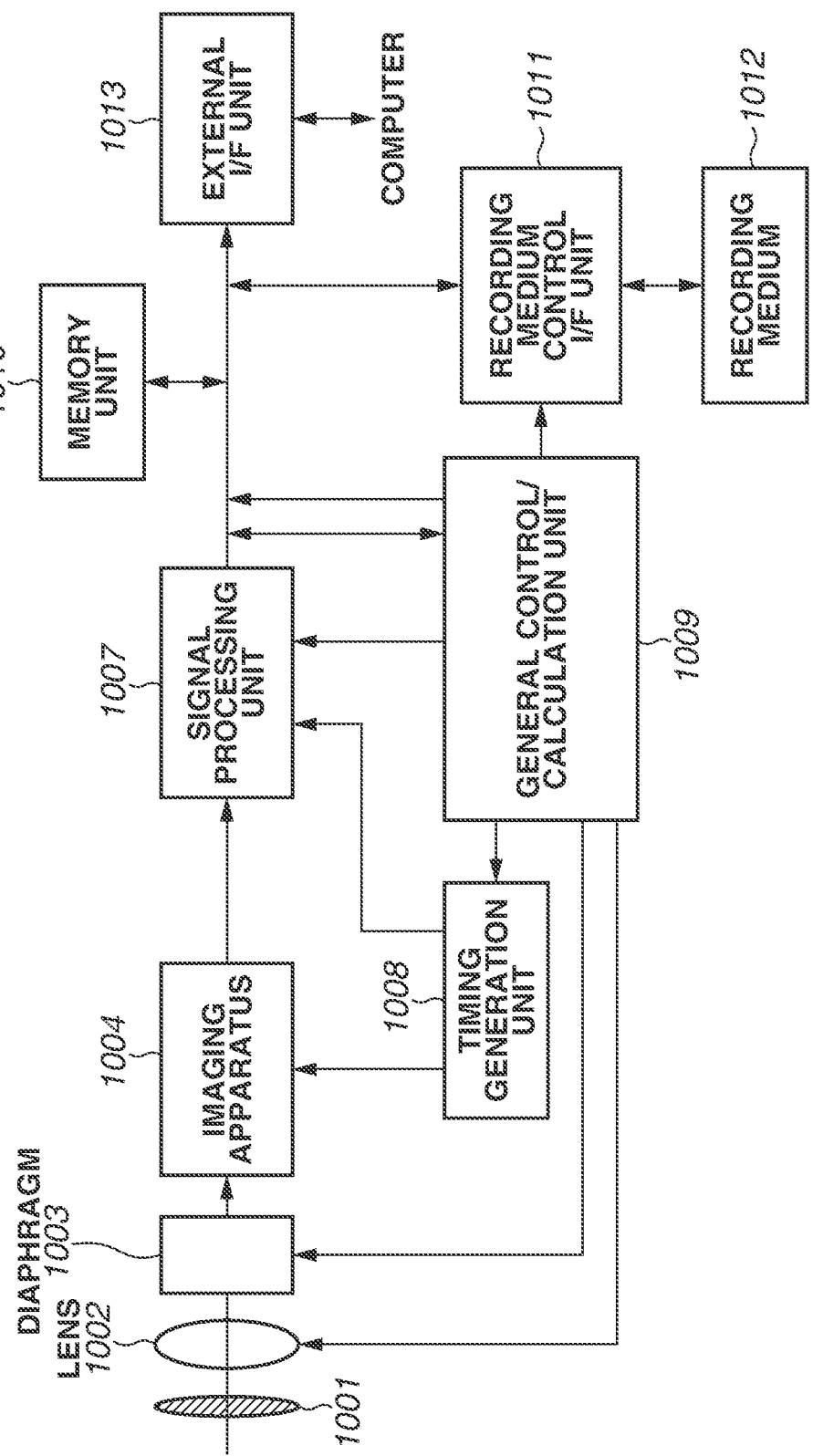
FIG. 8 illustrates a configuration of a photoelectric conversion system.

A third exemplary embodiment of the present disclosure will be described below. A photoelectric conversion system according to the present exemplary embodiment will be described below with reference to FIG. 8. FIG. 8 is a block diagram illustrating an overall configuration of the photoelectric conversion system according to the present exemplary embodiment.

The imaging apparatuses according to the first and the second exemplary embodiments are applicable to various photoelectric conversion systems. Examples of applicable photoelectric conversion systems include digital still cameras, digital camcorders, monitoring cameras, copying machines, facsimile machines, mobile phones, on-vehicle cameras, and observation satellites. Camera modules including an optical system, such as lenses, and an imaging apparatus are included in such photoelectric conversion systems. FIG. 8 is a block diagram illustrating a digital still camera as an example of photoelectric conversion systems.

The photoelectric conversion system illustrated in FIG. 8 includes an imaging apparatus 1004, a lens 1002 for forming an optical image of a subject on the imaging apparatus 1004, a diaphragm 1003 for varying an amount of the light passing through the lens 1002, and a barrier 1001 for protecting the lens 1002. The lens 1002 and the diaphragm 1003 form an optical system for condensing light to the imaging apparatus 1004. The imaging apparatus 1004 is a photoelectric conversion apparatus (imaging apparatus) according to either one of the above-described exemplary embodiments, and converts an optical image formed by the lens 1002 into an electrical signal.

The photoelectric conversion system includes a signal processing circuit 1007 as an image generation unit for generating an image by processing an output signal output from the imaging apparatus 1004. The signal processing circuit 1007 performs various types of correction and compression as required and outputs image data. The signal processing circuit 1007 may be formed on a semiconductor substrate on which the imaging apparatus 1004 is disposed, or formed on a semiconductor substrate different from the substrate of the imaging apparatus 1004. The imaging apparatus 1004 and the signal processing circuit 1007 may be formed on the same semiconductor substrate.

The photoelectric conversion system further includes a memory unit 1010 for temporarily storing image data, and an external interface (I/F) unit 1013 for communicating with an external computer. The photoelectric conversion system further includes a recording medium 1012, such as a semiconductor memory for recording and reading image data, and a recording medium control interface (I/F) unit for recording and reading image data to/from the recording medium 1012. The recording medium 1012 may be built in the photoelectric conversion system, or may be attachable to and detachable from the photoelectric conversion system.

The photoelectric conversion system further includes a general control/calculation unit 1009 for performing various calculations and controlling the entire digital still camera, and a timing generation unit 1008 for outputting various timing signals to the imaging apparatus 1004 and the signal processing circuit 1007. Here, timing signals may be input from the outside, and the photoelectric conversion system is to include at least the imaging apparatus 1004, and the signal processing circuit 1007 for processing the output signal output from the imaging apparatus 1004.

As described above, the present exemplary embodiment achieves a photoelectric conversion system to which the photoelectric conversion apparatus (imaging apparatus) according to either one of the above-described exemplary embodiments is applied.

In the first exemplary embodiment, an example has been described where the processing unit 106 compares the digital signals output by the reference pixel circuits 14 with expectation values. When a comparison unit for comparing the digital signals output by the reference pixel circuits 14 with expectation values is provided outside the photoelectric conversion apparatus (imaging apparatus), for example, the signal processing circuit 1007 can operate as a comparison unit. A comparison unit may be provided separately from the signal processing circuit 1007.

Figure 9A:
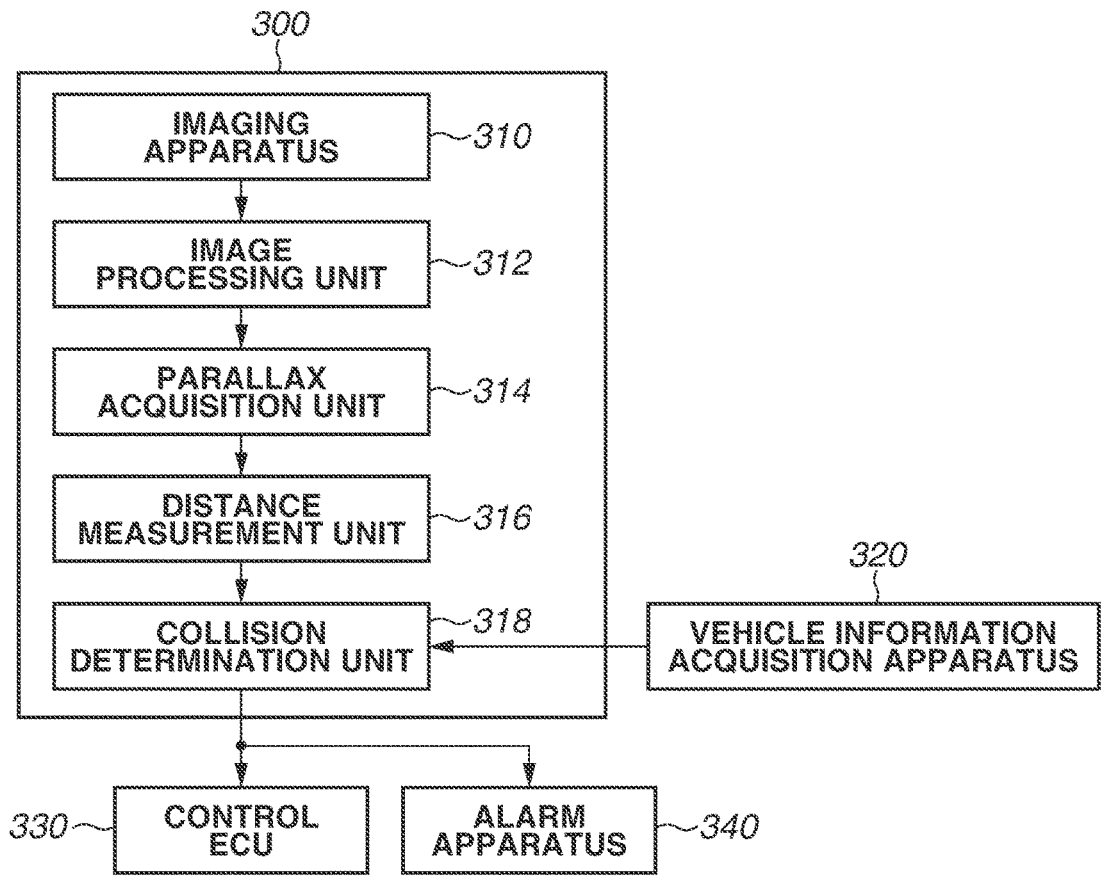
FIGS. 9A and 9B each illustrate a configuration and an operation of a moving body.
Figure 9B:
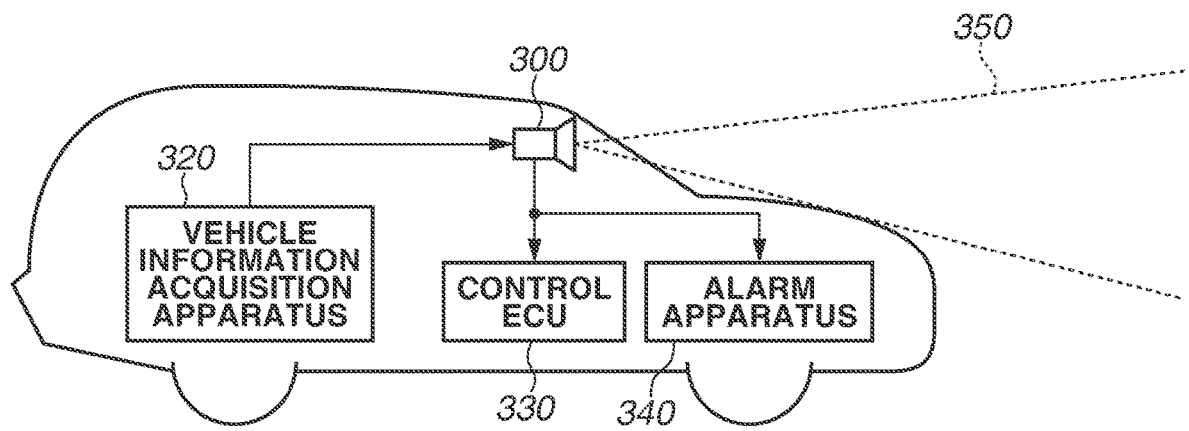

A fourth exemplary embodiment of the present disclosure will be described below. A photoelectric conversion system and a moving body according to the present exemplary embodiment will be described below with reference to FIGS. 9A and 9B. FIG. 9A illustrates a configuration of the photoelectric conversion system and FIG. 9B illustrates the moving body according to the present exemplary embodiment.

FIG. 9A illustrates an example of a photoelectric conversion system relating to an on-vehicle camera. A photoelectric conversion system 300 includes an imaging apparatus 310. The imaging apparatus 310 is the photoelectric conversion apparatus (imaging apparatus) according to either one of the above-described exemplary embodiments. The photoelectric conversion system 300 includes an image processing unit 312 for subjecting a plurality of image data pieces acquired by the imaging apparatus 310 to image processing, and a parallax acquisition unit 314 for calculating the parallax (phase difference between parallax images) from the plurality of image data pieces acquired by the photoelectric conversion system 300. The photoelectric conversion system 300 includes a distance acquisition unit 316 for calculating the distance to an object based on the calculated parallax, and a collision determination unit 318 for determining the possibility of collision based on the calculated distance. In this case, the parallax acquisition unit 314 and the distance acquisition unit 316 are merely examples of distance information acquisition units for acquiring information about the distance to the object. More specifically, the distance information is information about the parallax, the defocus amount, and the distance to the object. The collision determination unit 318 may determine the possibility of collision by using either one of these pieces of distance information. The distance information acquisition unit may be implemented by specially designed hardware or implemented by a software module. The distance information acquisition unit may also be implemented by a field-programmable gate array (FPGA), an application specific integrated circuit (ASIC), or a combination of both.

The photoelectric conversion system 300 is connected to a vehicle information acquisition apparatus 320 and can acquire vehicle information, such as the vehicle speed, yaw rate, and steering angle. The photoelectric conversion system 300 is connected to a control electronic control unit (ECU) 330 which is a control apparatus for outputting control signals for generating the braking force on a vehicle based on a determination result by the collision determination unit 318. The photoelectric conversion system 300 is also connected to a warning apparatus 340 for issuing an alarm to the driver based on a determination result by the collision determination unit 318. For example, if the possibility of collision is high based on a determination result by the collision determination unit 318, the control ECU 330 performs vehicle control for avoiding a collision to reduce damages, for example, by applying brakes, releasing the accelerator, or restraining the engine power. The warning apparatus 340 warns the user by generating an alarm sound, displaying alarm information on the screen of the car navigation system, or applying a vibration to the seat belt or steering wheel.

According to the present exemplary embodiment, the photoelectric conversion system 300 captures images of the surrounding of the vehicle, for example, images ahead or behind the vehicle. FIG. 9B illustrates the photoelectric conversion system in a case where images ahead of the vehicle (imaging range 350) are to be captured. The vehicle information acquisition apparatus 320 transmits an instruction to the photoelectric conversion system 300 or the imaging apparatus 310. The above-described configuration improves the accuracy of distance measurement.

While an example of control for avoiding a collision with other vehicles has been described in the present exemplary embodiment, the present exemplary embodiment is also applicable to automatic driving control for following another vehicle or automatic driving control so that the vehicle is not deviated from the lane. The photoelectric conversion system is applicable not only to vehicles but also to moving objects (moving apparatuses), such as vessels, airplanes, and industrial robots. In addition, the photoelectric conversion system 1301 is applicable not only to moving objects but also to a wide range of apparatuses utilizing object recognition, such as intelligent transport systems (ITS's).

[Modifications]

The present disclosure is not limited to the above-described exemplary embodiments and can be modified in diverse ways.

For example, the present disclosure also includes an exemplary embodiment in which a part of the configuration of another exemplary embodiment is appended, or an exemplary embodiment in which a part of the configuration is replaced with a part of the configuration of another exemplary embodiment.

The photoelectric conversion systems according to the third and the fourth exemplary embodiments are examples of photoelectric conversion systems to which the photoelectric conversion apparatus is applicable. Photoelectric conversion systems to which the photoelectric conversion apparatus according to the present disclosure is applicable are not limited to the configurations illustrated in FIGS. 8, 9A, and 9B.

The above-described exemplary embodiments are to be considered as illustrative in embodying the present disclosure, and not restrictive of the technical scope of the present disclosure. The present disclosure may be embodied in diverse forms without departing from the technical concepts or essential characteristics thereof.

The present disclosure makes it possible to offer a configuration and a checking method for suitably checking a photoelectric conversion apparatus in a case where pixel circuits include a holding unit for holding a digital signal.

While the present disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

This application claims the benefit of Japanese Patent Application No. 2019-215788, filed Nov. 28, 2019, which is hereby incorporated by reference herein in its entirety.

What is claimed is:

1. A photoelectric conversion apparatus comprising:
an effective pixel circuit including a photoelectric conversion unit, the effective pixel circuit being configured to be controlled by using a control line and to output a digital signal based on electric charges generated by the photoelectric conversion unit;
a reference pixel circuit including a holding unit for holding a digital signal input from outside of the reference pixel circuit, the reference pixel circuit being configured to be controlled by using the control line together with the effective pixel circuit;
a signal output circuit configured to output a signal to the holding unit so that a first digital signal with a predetermined value is held by the holding unit; and
a read control circuit configured to read the digital signal from the holding unit controlled to hold the first digital signal.

2. The photoelectric conversion apparatus according to claim 1, wherein the photoelectric conversion unit is an avalanche diode.

3. The photoelectric conversion apparatus according to claim 2,
wherein the photoelectric conversion apparatus includes a first output line through which the digital signal is output from the effective pixel circuit, and
wherein the effective pixel circuit comprises:
a quench element connected to the avalanche diode;
a waveform shaping circuit having an input node connected to the avalanche diode; and
a counter having an input node connected to an output node of the waveform shaping circuit, and
wherein a connection state between the output node of the counter and the first output line is controlled by using the control line.

4. The photoelectric conversion apparatus according to claim 2,
wherein the photoelectric conversion apparatus includes a first output line to which the digital signal is output from the effective pixel circuit, and
wherein the effective pixel circuit comprises:
a quench element connected to the avalanche diode;
a waveform shaping circuit having an input node connected to the avalanche diode;
a counter having an input node connected to an output node of the waveform shaping circuit; and
a second holding unit having an input node connected to the output node of the counter, and
wherein a connection state between the output node of the second holding unit and the first output line is controlled by using the control line.

5. The photoelectric conversion apparatus according to claim 1,
wherein the photoelectric conversion apparatus has a second output line to which the digital signal is output from the holding unit in the reference pixel circuit, and
wherein a connection state between an output node of the holding unit in the reference pixel circuit and the second output line is controlled by using the control line.

6. The photoelectric conversion apparatus according to claim 1, wherein, after a digital signal with a predetermined value is held by the holding unit, a pulse signal for changing the digital signal of the holding unit is supplied so that the digital signal held by the holding unit is changed.

7. The photoelectric conversion apparatus according to claim 1,
wherein a plurality of the effective pixel circuits is disposed in a plurality of rows and a plurality of columns, respectively,
wherein a plurality of the reference pixel circuits is disposed in each of the plurality of rows, and
wherein the first digital signal is a digital signal having a plurality of bits, and the first digital signal is a signal indicating a row where the respective plurality of reference pixel circuits is disposed.

8. The photoelectric conversion apparatus according to claim 1,
wherein a plurality of the effective pixel circuits is disposed in a plurality of rows and a plurality of columns, respectively,
wherein a plurality of the reference pixel circuits is disposed in each of the plurality of rows, and
wherein the first digital signal is a digital signal having a plurality of bits, and the first digital signal is an address signal indicating a row where the respective plurality of reference pixel circuits is disposed.

9. The photoelectric conversion apparatus according to claim 8,
wherein each of the plurality of effective pixel circuits comprises a third holding unit configured to hold a digital signal corresponding to the electric charges, and
wherein each of the plurality of effective pixel circuits further comprises a plurality of signal lines each being disposed to correspond to a different one of the plurality of columns where the plurality of effective pixel circuits is disposed, and the digital signal held by each third holding unit is output to the plurality of signal lines,
wherein a digital signal having a first value that is a predetermined value is held by the third holding unit in the effective pixel circuit in a first row of the plurality of rows,
wherein a digital signal having a second value that is a predetermined value different from the first value is held by the third holding unit in the effective pixel circuit in a second row of the plurality of rows, and
wherein, after the digital signal with the first value is output from the effective pixel circuit in the first row to the plurality of signal lines, the digital signal with the second value is subsequently output from the effective pixel circuit in the second row to the plurality of signal lines.

10. The photoelectric conversion apparatus according to claim 1, further comprising a comparison unit configured to compare the digital signal output from the reference pixel circuit with an expectation value.

11. A photoelectric conversion system comprising:
the photoelectric conversion apparatus according to claim 1; and
a signal processing circuit configured to generate an image by using signals output by the photoelectric conversion apparatus.

12. A photoelectric conversion system comprising:
the photoelectric conversion apparatus according to claim 1;
a signal processing circuit configured to generate an image by using signals output by the photoelectric conversion apparatus; and
a comparator configured to compare an expectation value with the digital signal output from the reference pixel circuit, output by the photoelectric conversion apparatus.

13. A moving body including the photoelectric conversion apparatus according to claim 1, wherein the moving body comprises a control unit configured to control a movement of the moving body by using signals output by the photoelectric conversion apparatus.

14. The photoelectric conversion apparatus according to claim 1, wherein the first digital signal is a digital signal having a plurality of bits.

15. The photoelectric conversion apparatus according to claim 1, wherein a plurality of the effective pixel circuits share an AD conversion unit.

16. A method for checking a photoelectric conversion apparatus comprising: a control line, an effective pixel circuit including a photoelectric conversion unit, the effective pixel circuit being configured to be controlled by using the control line and to output a digital signal based on electric charges generated by the photoelectric conversion unit, and a reference pixel circuit including a holding unit for holding a digital signal input from outside of the reference pixel circuit, the reference pixel circuit being configured to be controlled by using the control line together with the effective pixel circuit, the method comprising:
outputting a signal to the holding unit so that a first digital signal with a predetermined value is held by the holding unit; and
checking the photoelectric conversion apparatus by comparing the first digital signal with a digital signal read from the holding unit controlled to hold the first digital signal.

* * * * *